US008564515B2

(12) United States Patent
Kwak et al.

(10) Patent No.: US 8,564,515 B2
(45) Date of Patent: Oct. 22, 2013

(54) GATE DRIVER CIRCUIT AND DISPLAY DEVICE HAVING THE SAME

(75) Inventors: Yun-Hee Kwak, Seoul (KR); Jong-Woong Chang, Suwon-si (KR); Seong-Young Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 824 days.

(21) Appl. No.: 12/579,716

(22) Filed: Oct. 15, 2009

(65) Prior Publication Data

US 2010/0033455 A1 Feb. 11, 2010

Related U.S. Application Data

(62) Division of application No. 11/285,940, filed on Nov. 23, 2005, now abandoned.

(30) Foreign Application Priority Data

Jul. 5, 2005 (KR) ................................ 2005-59962

(51) Int. Cl.

| | |
|---|---|
| ***G09G 3/36*** | (2006.01) |
| ***G09G 3/20*** | (2006.01) |
| ***G09G 3/34*** | (2006.01) |
| ***G06F 3/038*** | (2013.01) |
| ***G09G 5/00*** | (2006.01) |
| ***H01L 29/66*** | (2006.01) |

(52) U.S. Cl.

USPC ................. 345/87; 345/55; 345/84; 345/204; 257/239

(58) Field of Classification Search

USPC ........................................................... 345/87

See application file for complete search history.

(56) References Cited

U.S. PATENT DOCUMENTS

| | | | | |
|---|---|---|---|---|
| 2003/0179174 | A1* | 9/2003 | Matsuda et al. | 345/100 |
| 2003/0189542 | A1* | 10/2003 | Lee et al. | 345/93 |
| 2004/0174334 | A1* | 9/2004 | Washio et al. | 345/102 |
| 2004/0189585 | A1* | 9/2004 | Moon | 345/100 |
| 2005/0012518 | A1 | 1/2005 | Lee | |

FOREIGN PATENT DOCUMENTS

KR 1020050008043 A 1/2005

* cited by examiner

*Primary Examiner* — Charles V Hicks
(74) *Attorney, Agent, or Firm* — Cantor & Colburn LLP

(57) ABSTRACT

A gate driver circuit includes a driving section and a wiring section. The wiring section receives a plurality of signals from an external device. The driving section includes a plurality of stages providing a plurality of gate lines with a gate signal. The wiring section includes first and second signal wirings. The first signal wiring is disposed adjacent to a first side of the driving section, where the first side receives the signals from the wiring section. The second signal wiring is disposed adjacent to a portion that is disposed at an outer side of the driving section and the first signal wiring. Therefore, a signal applied to the first signal wiring is prevented from being delayed by the second signal wiring. Furthermore, a distortion of signal applied to the gate driver and a maloperation of the gate driver are prevented.

18 Claims, 15 Drawing Sheets

LS

GATE DRIVER CIRCUIT AND DISPLAY DEVICE HAVING THE SAME

CROSS REFERENCE TO RELATED APPLICATIONS

This application is a divisional application of U.S. patent application Ser. No. 11/285,940, filed on Nov. 23, 2005, which claims priority to Korean Patent Application No. 2005-59962, filed on Jul. 5, 2005 and all the benefits accruing therefrom under 35 U.S.C. §119, and the contents of which in its entirety are herein incorporated by reference.

BACKGROUND OF THE INVENTION

1. Field of the Invention

The present invention relates to a gate driver circuit and a display device having the gate driver circuit. More particularly, the present invention relates to a gate driver circuit capable of preventing a signal distortion and a display device having the gate driver circuit.

2. Description of the Related Art

Generally, a liquid crystal display ("LCD") device includes an LCD panel that displays an image. The LCD panel includes a display area on which an image is displayed, and a peripheral area adjacent to the display area. No image is displayed through the peripheral area. A plurality of gate lines, a plurality of data lines, and a plurality of pixels are formed on the display area. Each pixel includes a thin film transistor ("TFT") and a liquid crystal capacitor. A gate driving circuit that provides the gate lines with a gate signal and a data driving circuit that provides the data lines with a data signal are formed on the peripheral area of the LCD panel.

The gate driver circuit is formed on one portion of the peripheral area of the LCD panel during a process of manufacturing the TFT in the display area, and the data driver circuit is formed as a chip mounted on another portion of the peripheral area of the LCD panel. The gate driver circuit includes a shift register having a plurality of stages electrically connected to each other in series. Each of the stages is electrically connected to a corresponding gate line, and applies a gate signal to the corresponding gate line. The gate driver circuit may further include a plurality of signal wirings that provide various signals to the stages of the shift register.

When the signal wirings are formed at the gate driver circuit, signals applied to the signal wirings may be distorted by a parasitic capacitance between the signal wirings.

Furthermore, the signal wirings are extended in nonparallel directions with each other to form crossing portions. When the crossing portions of the signal wirings increase, a signal applied from the signal wirings is delayed or a signal is distorted by signal interference. The signal delay or signal distortion induces a maloperation of the gate driver circuit.

BRIEF SUMMARY OF THE INVENTION

The present invention provides a gate driver circuit capable of preventing a signal distortion.

The present invention also provides a display device having the above-mentioned gate driver circuit.

In exemplary embodiments of the present invention, the gate driver circuit includes a driving section, a first wiring section, and a second wiring section. The driving section includes a plurality of stages providing a plurality of gate lines with a gate signal. The first wiring section is disposed at a first side of the driving section, and the first wiring section receives a plurality of signals. The second wiring section is disposed at an outer side of the driving section and the first wiring section.

In other exemplary embodiments of the present invention, the gate driver circuit includes a wiring section and a driving section. The wiring section receives a plurality of signals from an external device. The driving section includes a plurality of stages and has a first side and a second side. The first side of the driving section receives the plurality of signals from the wiring section, and the second side of the driving section provides a plurality of gate lines with a gate signal. The wiring section includes a first signal wiring and a second signal wiring. The first signal wiring is disposed adjacent to the first side of the driving section. The second signal wiring is disposed adjacent to the second side of the driving section.

In still other exemplary embodiments of the present invention, the display device includes a display panel, a gate driver circuit, and a data driver circuit. The display panel includes a plurality of gate lines and a plurality of data lines, and displays an image. The gate driver circuit includes a wiring section and a driving section. The wiring section receives a plurality of signals from an external device. The driving section includes a plurality of stages and has a first side and a second side. The driving section receives the plurality of signals from the wiring section through the first side, and the driving section transmits a gate signal to the plurality of gate lines through the second side. The data driver circuit provides the data lines with a data signal. The wiring section includes a first signal wiring and a second signal wiring. The first signal wiring is disposed adjacent to the first side of the driving section. The second signal wiring is disposed adjacent to the second side of the driving section.

In still further exemplary embodiments of the present invention, the display device includes a display panel, a gate driver circuit, and a data driver circuit. The display panel includes an array substrate having a plurality of gate lines and a plurality of data lines, and an opposite substrate facing the array substrate. The display panel receives a gate signal and a data signal, and displays an image. The gate driver circuit includes a wiring section and a circuit section having a plurality of stages. The wiring section receives a plurality of signals from an external device. The plurality of stages are connected one after another to each other. The plurality of stages sequentially output the gate signal to the plurality of gate lines in response to a plurality of signals from the wiring section. The data driver circuit outputs a data signal to the data lines. The wiring section includes at least one first signal wiring, a second signal wiring, and a third signal wiring. The at least one first signal wiring is electrically connected to at least two stages among the stages. The second signal wiring is electrically connected to a first stage of the plurality of stages. The third signal wiring is electrically connected to a last stage of the plurality of stages. The first signal wiring is disposed between the third signal wiring and the driving section.

In still other exemplary embodiments, a gate driver circuit includes a driving section providing a gate signal, a first wiring section receiving a plurality of signals, at least one connecting wiring connecting the first wiring section to the driving section, the at least one connecting wiring transmitting the plurality of signals to the driving section, and a start signal wiring transmitting a start signal to a first stage of the plurality of stages, wherein the start signal wiring does not cross the at least one connecting wiring.

According to the above, the first signal wiring of a wiring section is disposed at a first side of a driving section, and the second signal wiring is disposed at a second side of the driving section. Thus, a signal applied to the first signal wiring is prevented from being delayed by the second signal wiring.

Alternatively, a third signal wiring is disposed at an external portion rather than the first signal wiring, so that a distortion of signal applied to the gate driver is prevented. As a result, a maloperation of the gate driver is prevented.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Figure 1:
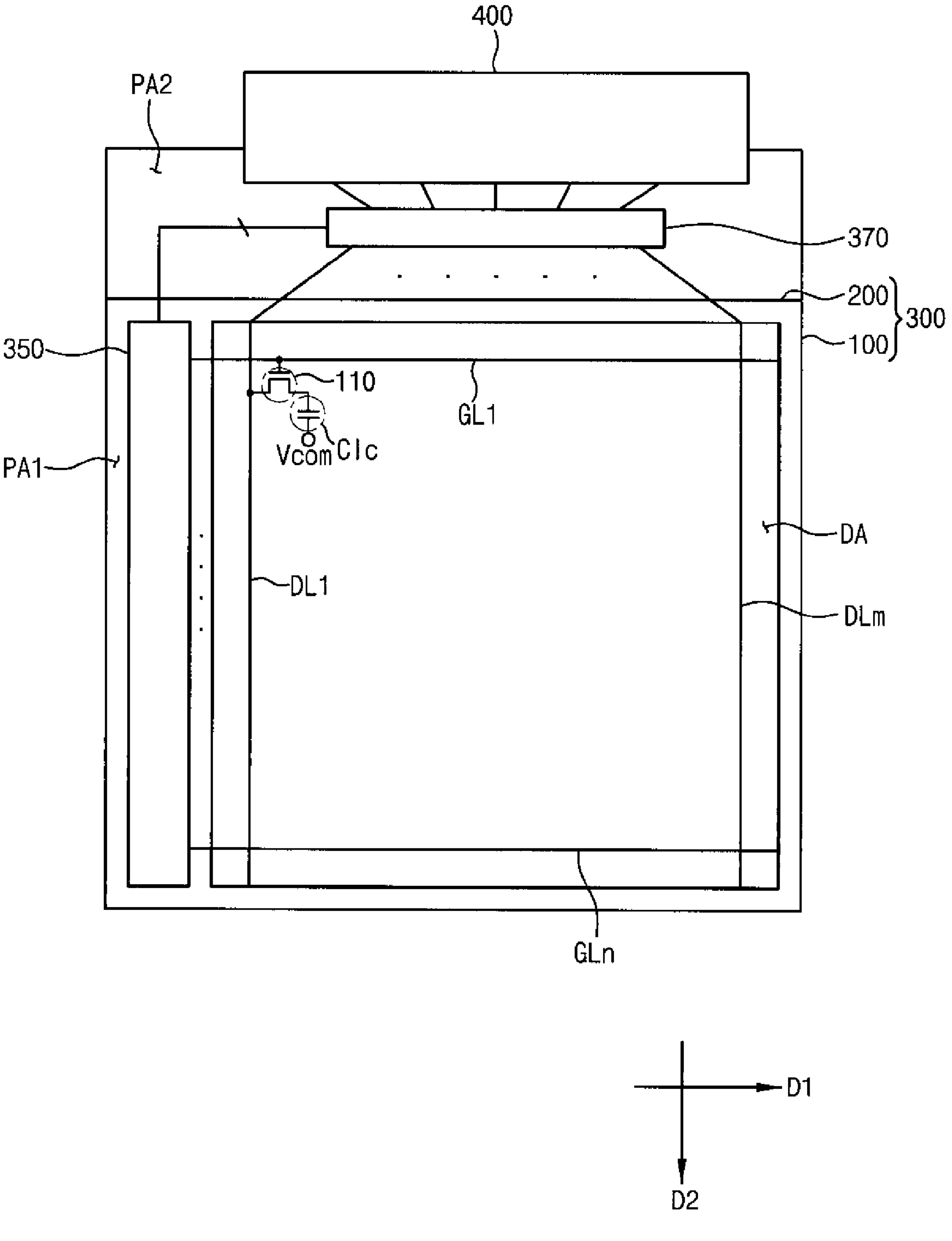
FIG. 1 is a schematic plan view showing an exemplary embodiment of a display device according to the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a schematic plan view showing an exemplary embodiment of a display device according to the present invention.

Referring to FIG. 1, the display device includes a liquid crystal display ("LCD") panel 300. The LCD panel 300 includes an array substrate 100, an opposite substrate 200 facing the array substrate 100, and a liquid crystal layer (not shown) interposed between the array substrate 100 and the opposite substrate 200. The opposite substrate 200 may also be known as a common electrode panel or a color filter panel.

The LCD panel 300 includes a display area DA that displays an image, and first and second peripheral areas PA1 and PA2 adjacent to the display area DA. The display area DA may be rectangular shaped as shown, with first and second opposite sides and third and fourth opposite sides. The first peripheral area PA1 may be adjacent a first side of the display area DA, and the second peripheral area PA2 may be adjacent a third side of the display area DA. In other words, the first peripheral area PA1 and the second peripheral area PA2 may be positioned adjacent sides of the display area DA that are perpendicular to each other.

First through n-th gate lines GL1~GLn and first through m-th data lines DL1~DLm are disposed at the display area DA, wherein 'n' and 'm' represent an even number. Only two gate lines GL1 and GLn and two data lines DL1 and DLm are illustrated for clarity, however a plurality of gates lines may be positioned between gate lines GL1 and GLn and a plurality of data lines may be positioned between data lines DL1 and DLm. The gate lines GL1~GLn are extended along a first direction D1. The data lines DL1~DLm are extended along a second direction D2 that is different from the first direction D1 so as to cross the gate lines GL1~GLn. The first direction D1 may be substantially perpendicular to the second direction D2. The gate lines GL1~GLn are electrically insulated from the data lines DL1~DLm. Therefore, pixel areas having a matrix shape defined by the gate lines GL1~GLn and the data lines DL1~DLm are formed on the display area DA. For example, a pixel area is defined between an adjacent pair of gate lines and an intersecting adjacent pair of data lines.

A pixel having a thin film transistor ("TFT") 110 and a liquid crystal capacitor Clc that is electrically connected to the TFT 110 is formed on each of the pixel areas. For example, a gate electrode of the TFT 110 is electrically connected to the first gate line GL1, a source electrode of the TFT 110 is electrically connected to the first data line DL1, and a drain electrode of the TFT 110 is electrically connected to the liquid crystal capacitor Clc. While only one pixel is shown in FIG. 1 for clarity, it should be understood that a plurality of pixels are provided within the display area DA.

The first peripheral area PA1 is adjacent to one side portion of the gate lines GL1~GLn. In other words, each of the gate lines GL1~GLn includes a first end and a second end, and the first peripheral area PA1 is adjacent the first ends of the gate lines GL1~GLn. A gate driver circuit 350, for example, is formed on the first peripheral area PA1. The gate driver circuit 350 sequentially applies gate signals to the gate lines GL1~GLn. The gate driver circuit 350 and the TFT 110 are formed on the first peripheral area PA1 and formed on the display area DA, respectively, through a same process. For example, during a method of manufacturing, the gate driver circuit 350 and the TFT 110 may be formed during a same step or set of steps.

The second peripheral area PA2 is adjacent to one portion of the data lines DL1~DLm. For example, each of the data lines DL1~DLm includes a first end and a second end, and the second peripheral area PA2 is adjacent the first ends of the data lines DL1~DLm. A data driver chip 370, for example, is mounted on the second peripheral area PA2. The data driver chip 370 applies data signals to the data lines DL1~DLm, such as to first ends of the data lines DL1~DLm.

Further, a flexible printed circuit board ("FPC") 400 is attached to one portion of the second peripheral area PA2. The FPC 400 electrically connects the LCD panel 300 and an outer or external device (not shown) for driving thereof.

The FPC 400 is electrically connected to the data driver chip 370. The FPC 400 provides the data driver chip 370 with a first control signal from the external device. Therefore, the data driver chip 370 outputs the data signal to the data lines DL1~DLm in response to the first control signal.

The FPC 400 may also be electrically connected to the gate driver circuit 350 through the data driver chip 370, or directly electrically connected to the gate driver circuit 350. The FPC 400 provides the gate driver circuit 350 with a second control signal from the external device, and the gate driver circuit 350 applies the gate signal to the gate lines GL1~GLn in response to the second control signal from the FPC 400.

Figure 2:
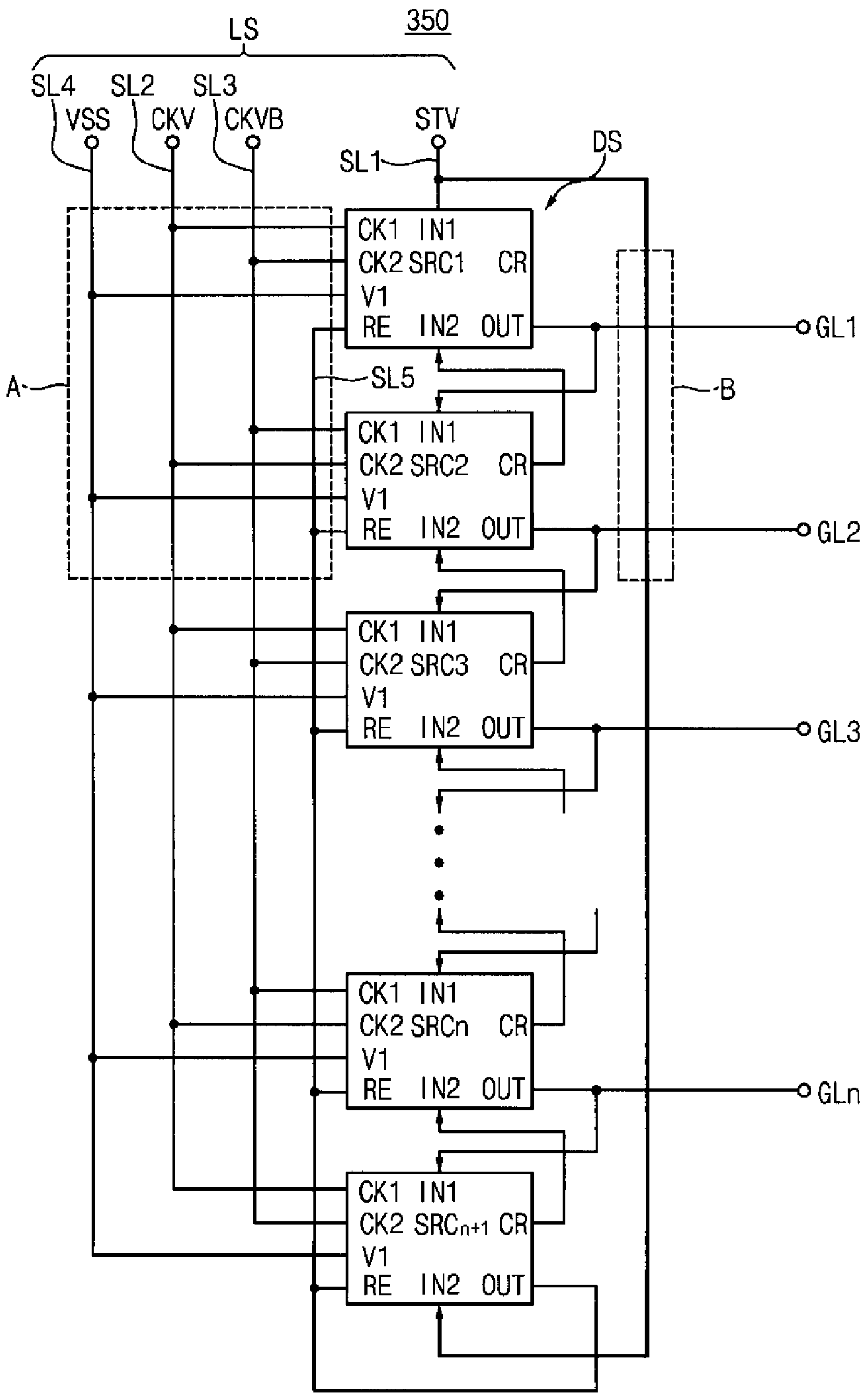
FIG. 2 is a block diagram showing an exemplary gate driver circuit in FIG. 1.

FIG. 2 is a block diagram showing an exemplary gate driver circuit in FIG. 1.

Referring to FIG. 2, the gate driver circuit 350 includes a driving section DS that outputs gate signals to the gate lines GL1~GLn sequentially and a wiring section LS that transmits various control signals to the driving section DS. The gate driver circuit 350 includes a plurality of stages SRC1~SRCn+1, wherein 'n' represents an even number.

Each of the stages SRC1~SRCn+1 includes a first clock terminal CK1, a second clock terminal CK2, a first input terminal IN1, a second input terminal IN2, a reference voltage terminal V1, a reset terminal RE, an output terminal OUT, and a carry terminal CR.

Each of the first clock terminals CK1 of odd-numbered stages SRC1, SRC3, . . . , SRCn+1 receives a first clock signal CKV, and each of the first clock terminals CK1 of even-numbered stages SRC2, . . . , SRCn receives a second clock signal CKVB having an opposite phase to that of the first clock signal CKV. Also, the second clock terminal CK2 of odd-numbered stages SRC1, SRC3, . . . , SRCn+1 receives the second clock signal CKVB, and the second clock terminal CK2 of even-numbered stages SRC2, . . . , SRCn receives the first clock signal CKV.

Except for within the first stage SRC1, the first input terminal IN1 receives a signal that is outputted from the output terminal OUT of a previous stage, and except for the last stage SRCn+1, the second input terminal IN2 receives a carry signal that is outputted from the carry terminal CR of a following stage.

The first input terminal IN1 of the first driving stage SRC1 receives a start signal STV instead of an output signal applied from the previous stage. The second input terminal IN2 of an (n+1)-th stage SRCn+1 receives the start signal STV instead of a carry signal applied from the following stage. The (n+1)-th stage SRCn+1 is disposed in order to provide a second input terminal IN2 of an n-th stage SRCn with a carry signal. The reference voltage terminal V1 of the stages SRC1~SRCn+1 receives the reference voltage VSS, and the reset terminal RE of the stages SRC1~SRCn+1 receives a signal applied from the output terminal OUT of the (n+1)-th stage SRCn+1.

The first clock signal CKV is outputted through an output terminal OUT of the odd-numbered stages SRC1, SRC3, . . .

, SRCn+1, and the second clock signal CKVB is outputted through an output terminal OUT of the even-numbered stages SRC2, . . . , SRCn. Each output terminal OUT of the stages SRC1~SRCn is electrically connected to a corresponding gate line among first through n-th gate lines GL1~GLn that are disposed at the display area DA (shown in FIG. 1). Therefore, the driving section DS sequentially outputs a gate signal to the first through n-th gate lines GL1~GLn.

The wiring section LS is adjacent to the driving section DS. The wiring section LS includes a start signal wiring SL1, a first clock wiring SL2, a second clock wiring SL3, a reference voltage wiring SL4, and a reset wiring SL5, all of which are extended substantially in parallel with each other.

The reset wiring SL5 is adjacent to a first side of the driving section DS having first and second clock terminals CK1 and CK2 of each stage. The reference voltage wiring SL4 is adjacent to an outermost outline portion of the first side. In other words, the reference voltage wiring SL4 is within a portion of the wiring section LS furthest from the driving section DS. The first and second clock wirings SL2 and SL3 are interposed between the reset wiring SL5 and the reference voltage wiring SL4. The second clock wiring SL3 is adjacent to the reset wiring SL5, and the first clock wiring SL2 is adjacent to the reference voltage wiring SL4.

The first clock signal CKV is provided to the first clock terminal CK1 of the odd-numbered stages SRC1, SRC3, . . . , SRCn+1 and the second terminal CK2 of the even-numbered stages SRC2, . . . , SRCn through the first clock wiring SL2. The second clock signal CKVB is provided to the second clock terminal CK2 of the odd-numbered stages SRC1, SRC3, . . . , SRCn+1 and the first clock terminal CK1 of the even-numbered stages SRC2, . . . , SRCn through the second clock wiring SL3. The reference voltage VSS is provided to the reference voltage terminal V1 of a plurality of stages SRC1~SRCn+1 through the reference voltage wiring SL4, and the reset signal RESET is provided to the reset terminal RE of a plurality of stages SRC1~SRCn+1 through the reset wiring SL5.

The start signal wiring SL1 is adjacent to a second side of the driving section DS having an output terminal OUT of each stage. The start signal wiring SL1 is extended from the first stage SRC1 to the last stage SRCn+1 in order to provide the first stage SRC1 and last stage SRCn+1 with the start signal STV provided from an external device. Therefore, the start signal STV is applied to the first input terminal IN1 of the first stage SRC1 and the second input terminal IN2 of the last stage SRCn+1 through the start signal wiring SL1.

Because the start signal wiring SL1 is adjacent to the second side of the driving section DS, the start signal wiring SL1 is extended from the first stage SRC1 to the last stage SRCn+1, so that the start signal wiring SL1 crosses first through n-th gate lines GL1~GLn that are electrically connected to the output terminal OUT of the stages SRC1~SRCn.

Hereinafter, a positional relation between the start signal wiring SL1 and the first through n-th gate lines GL1~GLn is described in further detail with reference to FIGS. 3A, 3B, 4A, and 4B.

Figure 3A:
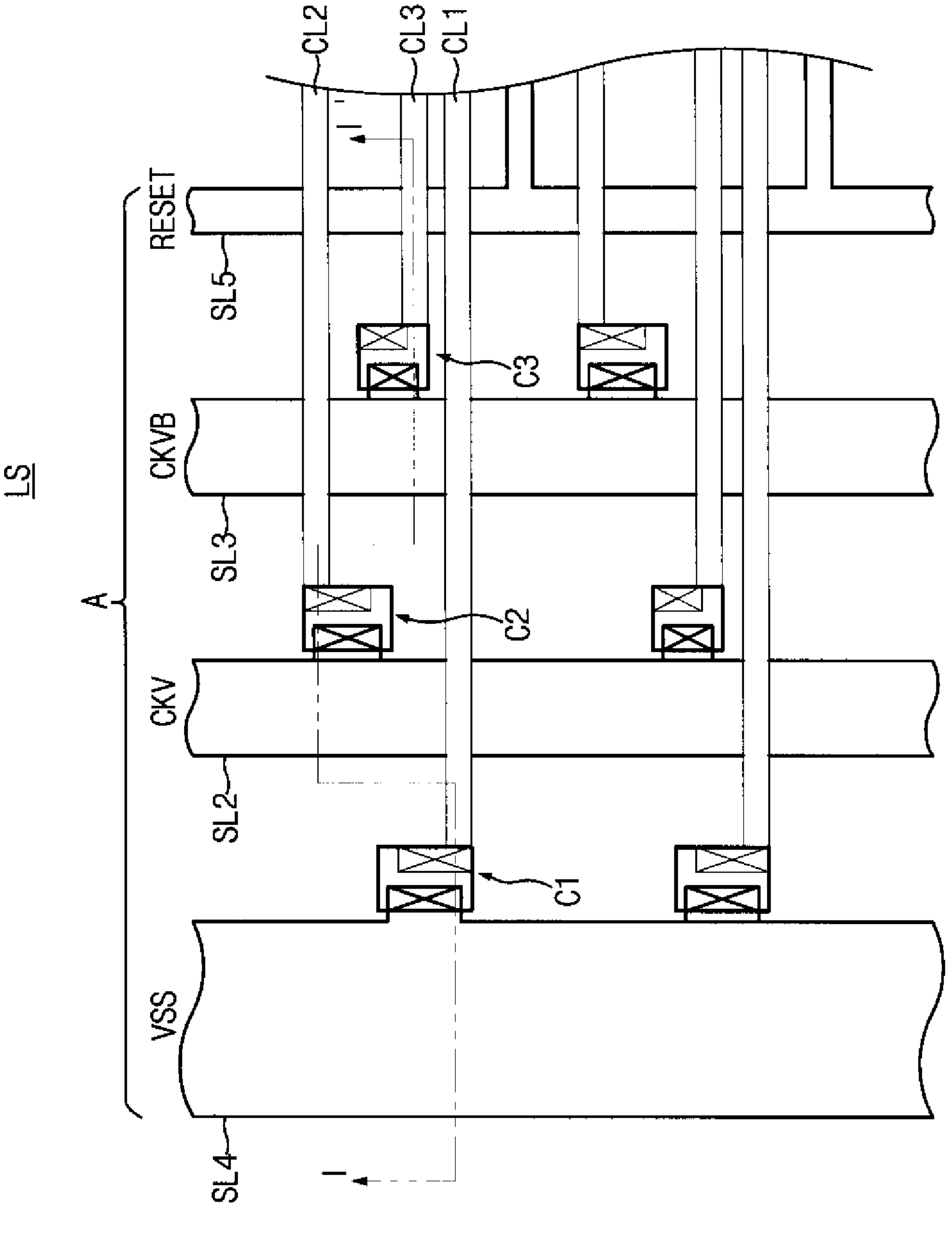
FIGS. 3A and 3B are enlarged views showing portion 'A' and portion 'B', respectively, in FIG. 2.
Figure 3B:
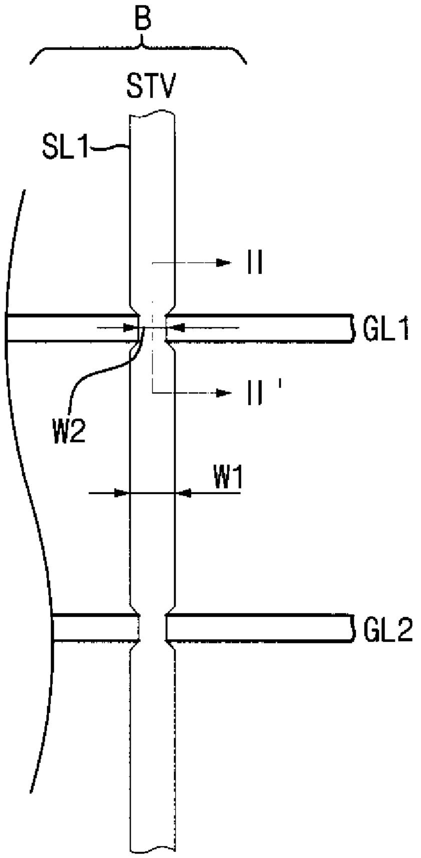
Figure 4A:
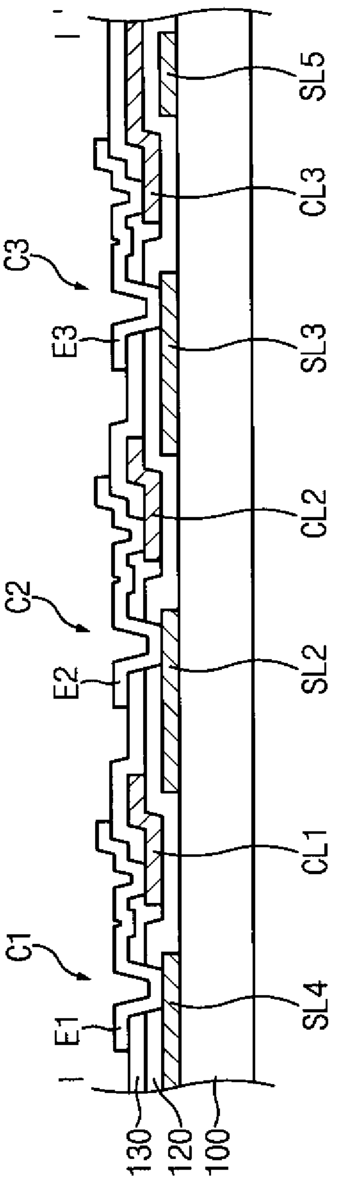
FIGS. 4A and 4B are cross-sectional views taken along lines I-I' in FIG. 3A and line II-II' in FIG. 3B, respectively.
Figure 4B:
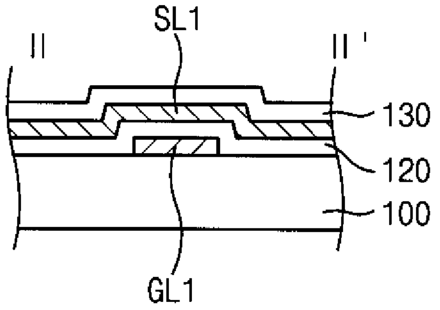

FIGS. 3A and 3B are enlarged views showing portion 'A' and portion 'B', respectively, in FIG. 2. FIGS. 4A and 4B are cross-sectional views taken along line I-I' in FIG. 3A and line II-II' in FIG. 3B, respectively.

Referring to FIGS. 3A and 3B, a wiring section LS includes a start signal wiring SL1, a first clock wiring SL2, a second clock wiring SL3, a reference voltage wiring SL4, and a reset wiring SL5. The wiring section LS may further include a first connecting wiring CL1 that electrically connects the reference voltage wiring SL4 to each of the stages SRC1~SRCn+1 of the driving section DS (see FIG. 2), a second connecting wiring CL2 that electrically connects the first clock wiring SL2 to each of the stages SRC1~SRCn+1, and a third connecting wiring CL3 that electrically connects the second clock wiring SL3 to each of the stages SRC1~SRCn+1.

The first through third connecting wirings CL1~CL3 are extended from the reference voltage wiring SL4, the first clock wiring SL2, and the second clock wiring SL3 to the driving section DS, respectively. The first through third connecting wirings CL1~CL3 are formed on a different layer from that of the signal wirings SL2~SL5. Thus, during a method of manufacturing, the first through third connecting wirings CL1~CL3 are formed during a different step than a step when the signal wirings SL2~SL5 are formed.

Referring to FIGS. 4A and 4B, the reference voltage wiring SL4, a first clock wiring SL2, a second clock wiring SL3, and a reset wiring SL5 that each include a first metal layer are formed on the array substrate 100, and a gate insulating layer 120 is formed thereon to cover the reference voltage wiring SL4, the first clock wiring SL2, the second clock wiring SL3, and the reset wiring SL5. The gate insulating layer 120 exposes the reference voltage wiring SL4, the first clock wiring SL2, and the second clock wiring SL3 through the first through third contact areas C1~C3. In other words, the gate insulating layer 120 includes contact holes forming a first contact area C1, a second contact area C2, and a third contact area C3. A portion of the reference voltage wiring SL4 is exposed in the first contact area C1, a portion of the first clock wiring SL2 is exposed in the second contact area C2, and a portion of the second clock wiring SL3 is exposed in the third contact area C3. The first through third connecting wirings CL1~CL3 including a second metal layer are formed on the gate insulating layer 120, and a protecting layer 130 is formed on the gate insulating layer 120 having the first through third connecting wirings CL1~CL3 formed thereon to cover the first through third connecting wirings CL1~CL3. The protecting layer 130 exposes the first through third connecting wirings CL1~CL3 in the first through third contact areas C1~C3. In other words, a portion of the first connecting wiring CL1 is exposed in the first contact area C1, a portion of the second connecting wiring CL2 is exposed in the second contact area C2, and a portion of the third connecting wiring CL3 is exposed in the third contact area C3.

A first metal electrode E1, a second metal electrode E2, and a third metal electrode E3 are formed on the protecting layer 130. The first metal electrode E1 electrically connects the reference voltage wiring SL4 to the first connecting wiring CL1 in the first contact area C1. The second metal electrode E2 electrically connects the first clock wiring SL2 to the second connecting wiring CL2 in the second contact area C2. The third metal electrode E3 electrically connects the second clock wiring SL3 to the third connecting wiring CL3 in the third contact area C3. The first through third metal electrodes E1~E3 include an optically transparent and electrically conductive material. For example, the first through third metal electrodes E1~E3 include indium tin oxide ("ITO"), indium zinc oxide ("IZO"), etc.

Referring again to FIGS. 3A through 4B, the start signal wiring SL1 crosses the first and second gate lines GL1 and GL2, although it may also cross other gate lines not illustrated herein. The first gate line GL1 that includes the first metal layer, as does the wirings SL2~SL5, is formed on the array substrate 100, and a gate insulating layer 120 is formed thereon. The start signal wiring SL1 is formed on the gate insulating layer 120, so that the start signal wiring SL1 is electrically insulated from the first gate line GL1. The start signal wiring SL1 may be formed from the second metal layer, as are the first through third connecting wirings CL1~CL3.

The start signal wiring SL1 has a first width W1. The start signal wiring SL1 has a second width W2 that is smaller than the first width W1 at a region disposed over the first gate line GL1 in order to decrease a parasitic capacitance induced between the start signal wiring SL1 and the first gate line GL1. Similarly, the start signal wiring SL1 may have the second width W2 at regions disposed over the second gate line GL2 and the other remaining gate lines GL3~GLn.

When the start signal wiring SL1 that is electrically connected to the first stage SRC1 is also electrically connected to the last stage SRCn+1 (as shown in FIG. 2), the start signal wiring SL1 is disposed at the second side of the driving section DS that is opposite to the first side, where remaining signal wirings SL2~SL5 are disposed. Therefore, a parasitic capacitance induced between the remaining signal wirings SL2~SL5 and the start signal wiring SL1 is decreased. The second side of the driving section DS may be the side of the driving section DS closest to the display area DA.

Particularly, the reference voltage wiring SL4, and the first and second clock wirings SL2 and SL3 receive the reference voltage VSS, and the first and second clock signals CKV and CKVB, respectively. However, each of the first through n-th gate lines GL1~GLn receives a gate signal one by one during one frame. If the start signal wiring SL1 is instead disposed between the second clock wiring SL3 and the driving section DS, then the first through third connecting wirings CL1~CL3 would cross the start signal wiring SL1. Therefore, signals provided through the first through third connecting wirings CL1~CL3 would be distorted. In the embodiments shown in FIGS. 2-4, however, when the start signal wiring SL1 crosses the first through n-th gate lines GL1~GLn, a distortion of signals induced by the start signal wiring SL1 is prevented.

Figure 5:
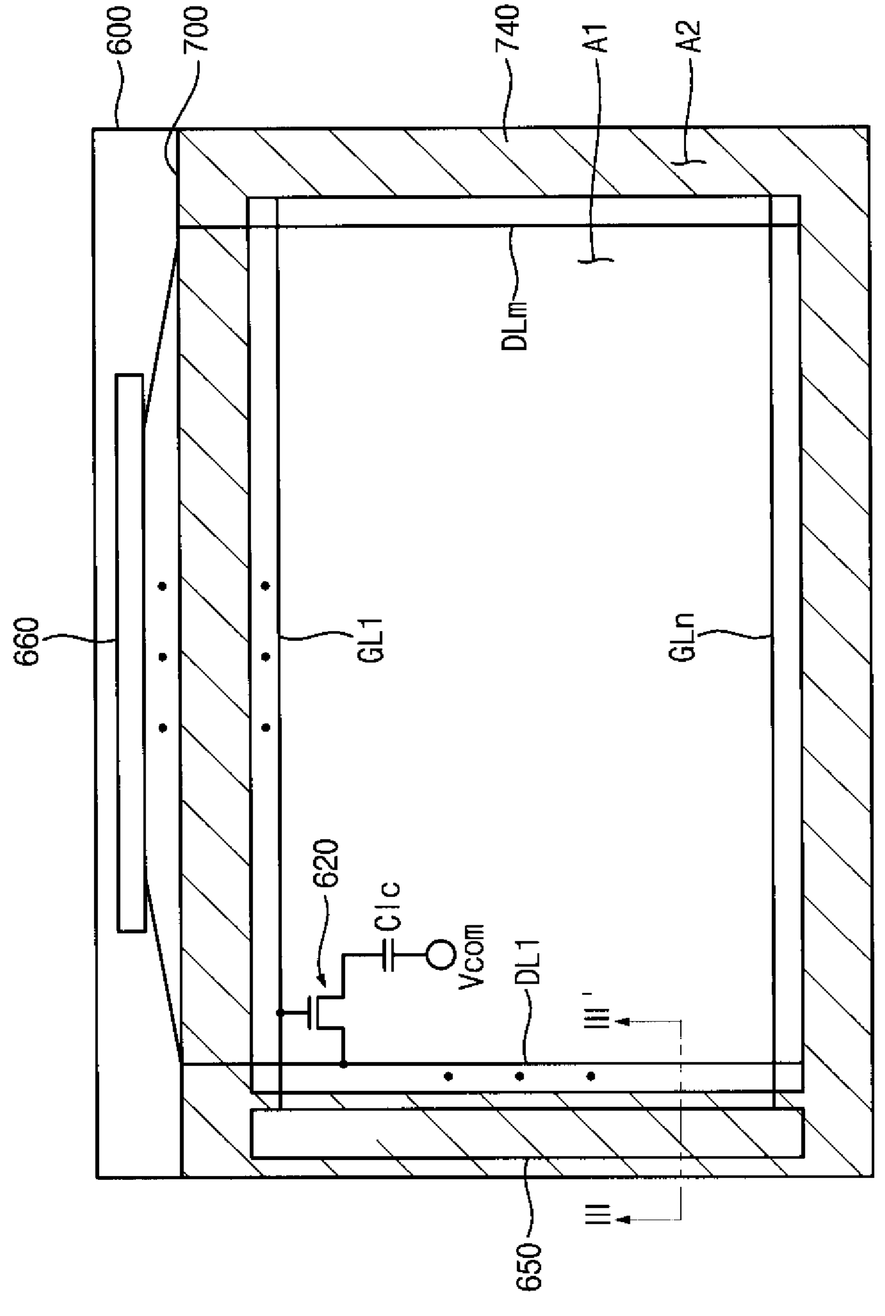
FIG. 5 is a schematic plan view showing another exemplary embodiment of a display device according to the present invention.
Figure 6:
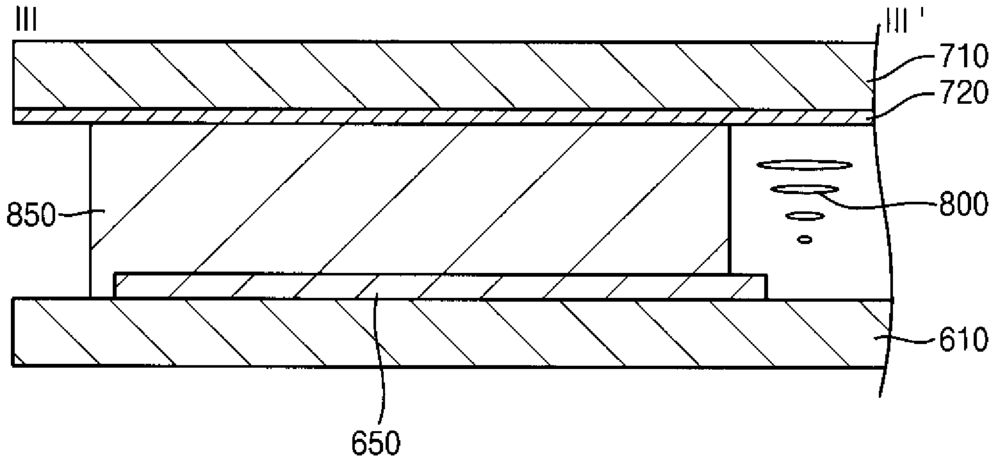
FIG. 6 is a cross-sectional view taken along line III-III' in FIG. 5.

FIG. 5 is a schematic plan view showing another exemplary embodiment of a display device according to the present invention. FIG. 6 is a cross-sectional view taken along line III-III' in FIG. 5.

Referring to FIGS. 5 and 6, the display device includes an LCD panel. The LCD panel includes an array substrate 600, an opposite substrate 700 facing the array substrate 600, and a liquid crystal layer 800 interposed between the array substrate 600 and the opposite substrate 700.

The array substrate 600 includes a first base substrate 610 and a pixel array. The pixel array includes a plurality of gate lines GL1~GLn (only two gate lines illustrated for clarity), a plurality of data lines DL1~DLm (only two data lines illustrated for clarity), a TFT 620, and a pixel electrode (not shown), wherein 'n' and 'm' represent natural numbers. The gate lines GL1~GLn, the data lines DL1~DLm, the TFT 620, and the pixel electrode are formed on the display area A1 of the first base substrate 610 through a process of manufacturing a thin film. While only one TFT 620 is illustrated for clarity, it should be understood that the array substrate 600 includes a plurality of such TFTs within each pixel area of the array substrate 600.

The gate lines GL1~GLn cross the data lines DL1~DLm such that the gate lines GL1~GLn are insulated from the data lines DL1~DLm. The TFT 620 and the pixel electrode are disposed on a pixel area defined by the gate lines GL1~GLn and the data lines DL1~DLm. The TFT 620 includes a gate electrode electrically connected to the gate line, a source electrode electrically connected to a corresponding data line, and a drain electrode electrically connected to the pixel electrode. The pixel electrode of the array substrate 600, a common electrode of the opposite substrate 700, and the liquid crystal layer 800 disposed between the pixel electrode and the common electrode define a liquid crystal capacitor Clc.

Further, a gate driver circuit 650 is disposed at the array substrate 600. The gate driver circuit 650 sequentially provides the gate lines GL1~GLn with gate signals. The gate driver circuit 650 is formed on the peripheral area A2 of the first base substrate 610 through a process of manufacturing a thin film.

A chip 660 having a data driver circuit is mounted on the first base substrate 610. The chip 660 is electrically connected to the data lines DL1~DLm, and the chip 660 provides the data lines DL1~DLm with a data signal.

The opposite substrate 700 includes a second base substrate 710 and a black matrix layer 720. The second base substrate 710 faces the first base substrate 610. The second base substrate 710 is, for example, a transparent glass substrate, and includes a display area A1 and a peripheral area A2 adjacent to the display area A1.

The black matrix layer 720 including a light-shielding material is formed on the peripheral area A2. For example, the black matrix layer 720 is also formed on a non-effective area of the display area A1. Here, the black matrix layer 720 includes, for example, a metal material such as, but not limited to, chromium (Cr).

The opposite substrate 700 may further include a common electrode (not shown) that is formed on the second base substrate 710 and the black matrix layer 720. The common electrode includes an optically transparent and electrically conductive material such as, but not limited to ITO, IZO, etc.

Additionally, a sealant 850 is interposed between the array substrate 600 and the opposite substrate 700. The array substrate 600 and the opposite substrate 700 are combined with the sealant 850 through a thermo-compressing process. The sealant 850 is formed on the gate driver circuit 650, so that the sealant 850 covers the gate driver circuit 650 as shown in FIG. 6. Therefore, the sealant 850 decreases a parasitic capacitance induced between the gate driver circuit 650 and the common electrode of the opposite substrate 700.

Thereafter, when a liquid crystal material is injected into a space between the array substrate 600 and the opposite substrate 700, the liquid crystal layer 800 is formed therebetween.

Figure 7:
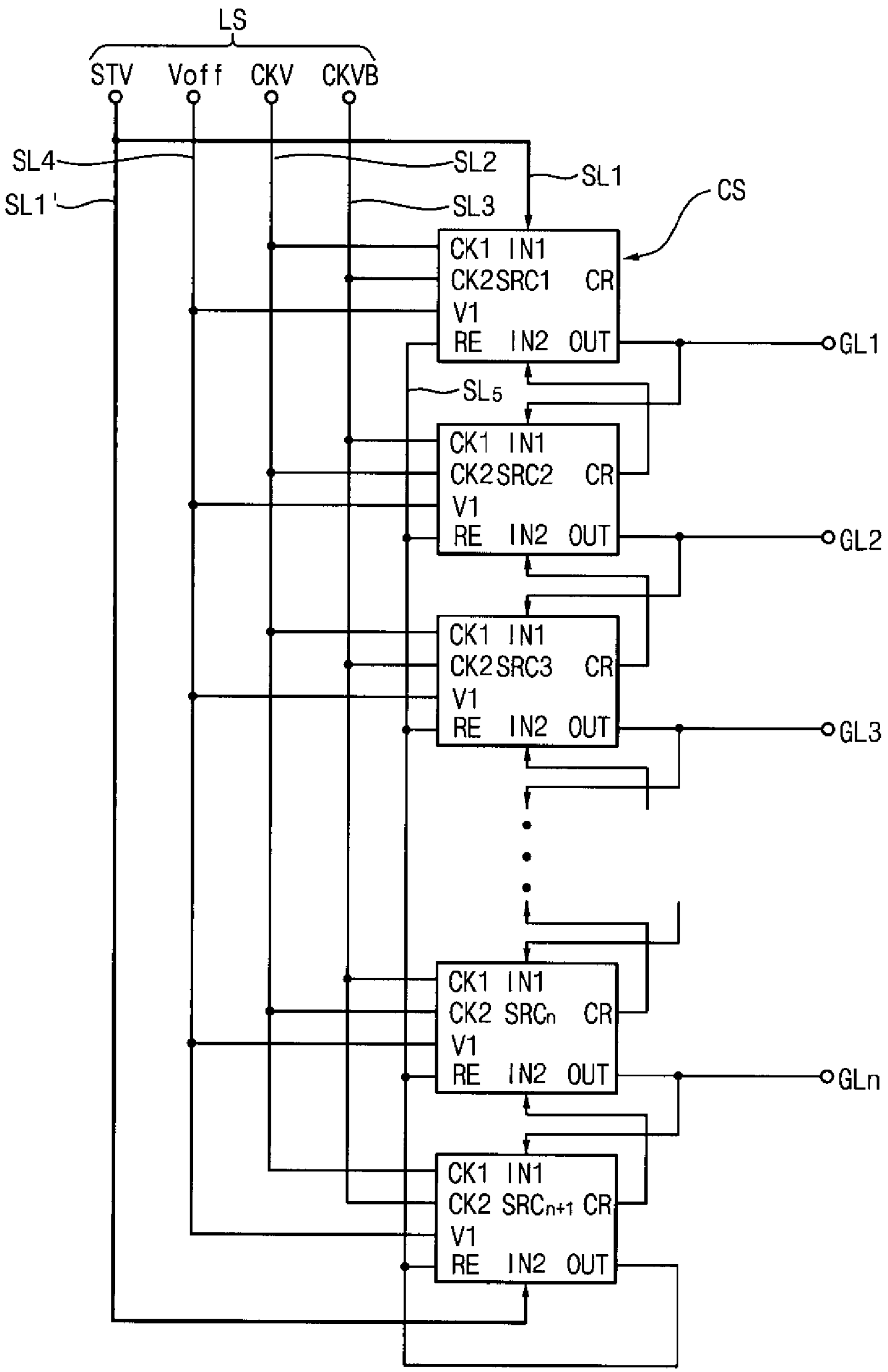
FIG. 7 is a block diagram showing an exemplary gate driver circuit in FIG. 5.

FIG. 7 is a block diagram showing an exemplary gate driver circuit in FIG. 5.

Referring to FIG. 7, the gate driver circuit 650 includes a circuit section CS, similar to the driving section DS of FIG. 2, and a wiring section LS that is adjacent to the circuit section CS.

The circuit section CS includes first through (n+1)-th stages SRC1~SRCn+1 that are cascade connected with each other, and sequentially transmits first through n-th gate signals OUT1~OUTn to gate lines GL1~GLn.

Each of the first through (n+1)-th stages SRC1~SRCn+1 includes a first clock terminal CK1, a second clock terminal CK2, a first input terminal IN1, a second input terminal IN2, an off-voltage terminal V1, a reset terminal RE, a carry terminal CR, and an output terminal OUT.

The first clock terminal CK1 of each of the odd-numbered stages SRC1, SRC3, . . . , SRCn+1 receives a first clock signal CKV, and the first clock terminal CK1 of each of even-numbered stages SRC2, . . . , SRCn receives a second clock signal CKVB having an opposite phase to the first clock signal CKV. Also, the second clock terminal CK2 of each of the odd-numbered stages SRC1, SRC3, . . . , SRCn+1 receives a second clock signal CKVB, and the second clock terminal CK2 of each of the even-numbered stages SRC2, . . . , SRCn receives a first clock signal CKV.

Each of the first input terminals IN1 of the second through (n+1)-th stages SRC2~SRCn+1 receives a previous gate signal from a previous stage. The first input terminal IN1 of the first stage SRC1 receives the start signal STV that activates an operation of the circuit section CS.

The second input terminal IN2 of each of the first through (n)-th stages SRC1~SRCn receives a following carry signal from the carry terminal CR of a following stage. The (n+1)-th stage SRCn+1 is a dummy stage that provides the second input terminal IN2 of the n-th stage SRCn with the carry signal. The second input terminal IN2 of the (n+1)-th stage SRCn+1 receives the start signal STV instead of a following carry signal applied from the following stage.

The off-voltage terminal V1 of the first through (n+1)-th stages SRC1~SRCn+1 receives the off-voltage Voff, and a reset terminal RE of the first through (n+1)-th stages SRC1~SRCn+1 receives a (n+1)-th gate signal applied from the (n+1)-th stage SRCn+1.

Each of the carry terminal CR and output terminal OUT of odd-numbered stages SRC1, SRC3, . . . , SRCn+1 receives a first clock signal CKV, and each of the carry terminal CR and output terminal OUT of even-numbered stages SRC2, . . . , SRCn receives a second clock signal CKVB having opposite phase to the first clock signal CKV. A carry signal provided from the carry terminal CR of the second to (n+1)-th stages SRC2~SRCn+1 is applied to the second input terminal IN2 of the previous stage. Further, first through n-th gate signals provided from the output terminal OUT of the previous stage are applied to the first input terminal IN1 of the following stage.

Additionally, the wiring section LS includes a first start signal wiring SL1, a second start signal wiring SL1', a first clock wiring SL2, a second clock wiring SL3, an off-voltage wiring SL4, and a reset wiring SL5.

The first start signal wiring SL1 transmits the start signal STV provided from an external device to the first input terminal IN1 of the first stage SRC1. The first start signal wiring SL1 is directly connected to the first input terminal IN1 of the first stage SRC1. The second start signal wiring SL1' transmits the start signal STV provided from an external device to the second input terminal IN2 of the last stage SRCn+1. The second start wiring SL1' is directly connected to the second input terminal IN2 of the last stage SRCn+1. The first start signal wiring SL1 and the second start signal wiring SL1' are also electrically connected to each other.

Also, the first clock wiring SL2 transmits the first clock signal CKV provided from an external device to the first clock terminal CK1 of the odd-numbered stages SRC1, SRC3, . . . , SRCn+1 and to the second clock terminal CK2 of the even-numbered stages SRC2, . . . , SRCn. The second clock wiring SL3 transmits the second clock signal CKVB applied from an external device to the first clock terminal CK1 of the even-numbered stages SRC2, . . . , SRCn and to the second clock terminal CK2 of the odd-numbered stages SRC1, SRC3, . . . , SRCn+1.

Further, the off-voltage wiring SL4 transmits an off-voltage Voff applied from an external device to the off-voltage terminal V1 of the first through (n+1)-th stages SRC1~SRCn+1. The reset wiring SL5 transmits an (n+1)-th gate signal provided from the output terminal OUT of the (n+1)-th stage SRCn+1 to the reset terminal RE of the first through (n+1)-th stages SRC1~SRCn+1.

As shown in FIG. 7, the reset wiring SL5, the second clock wiring SL3, the first clock wiring SL2, the off-voltage wiring SL4, and the second start signal wiring SL1' are disposed adjacent to the circuit section CS in that order. That is, out of the wirings SL5, SL3, SL2, SL4, and SL1', the reset wiring SL5 is disposed first closest (and fifth furthest) to the circuit section CS, the second clock wiring SL3 is disposed second closest (and fourth furthest) to the circuit section CS, the first clock wiring SL2 is disposed third closest (and third furthest) to the circuit section CS, the off-voltage wiring SL4 is disposed fourth closest (and second furthest) to the circuit section CS, and the second start signal wiring SL1' is disposed fifth closest (and first furthest) to the circuit section CS.

Hereinafter, a structure of the wiring section LS is explained in further detail with reference to FIG. 8.

Figure 8:
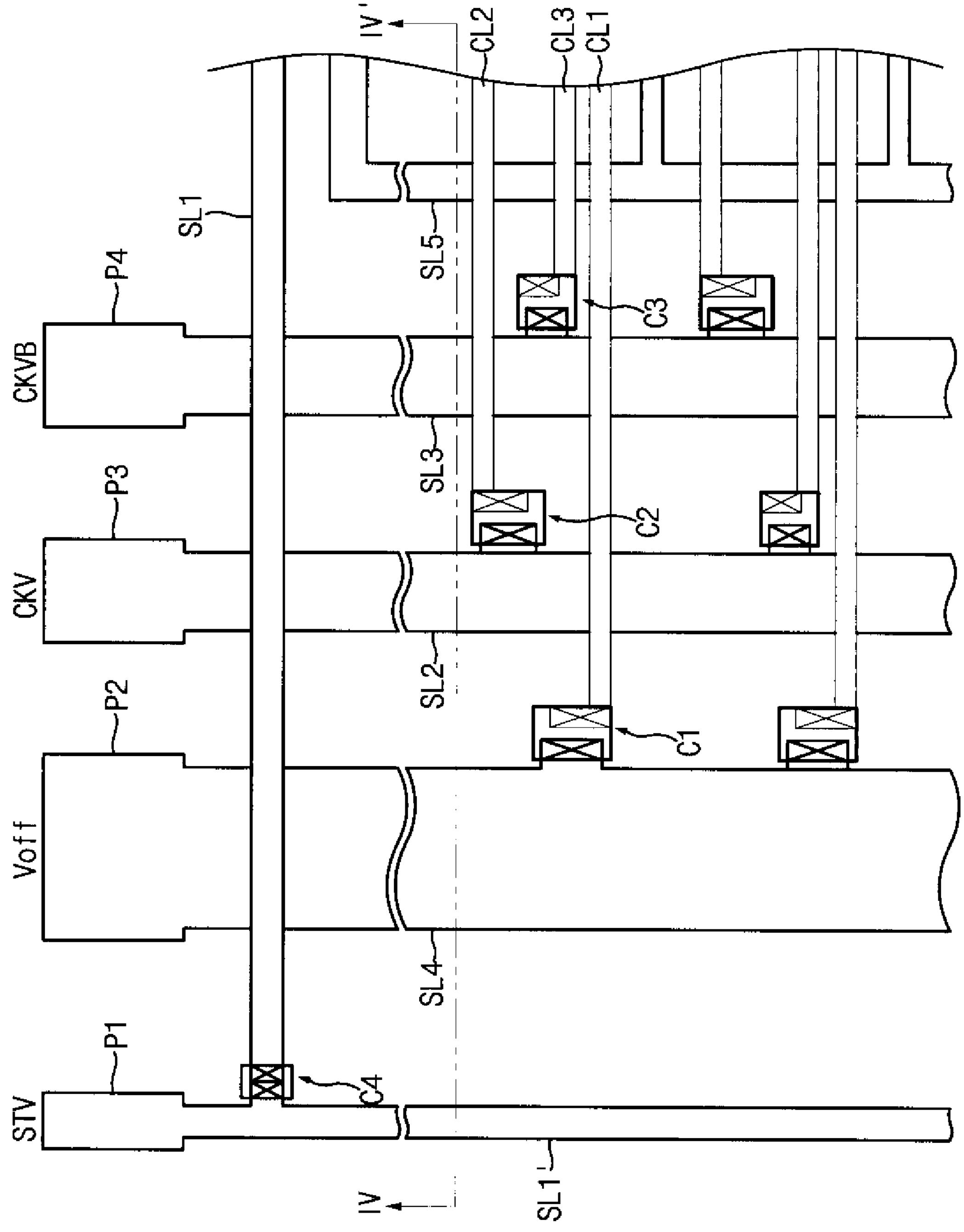
FIG. 8 is an enlarged view showing a portion of the exemplary wiring section in FIG. 7.
Figure 9:
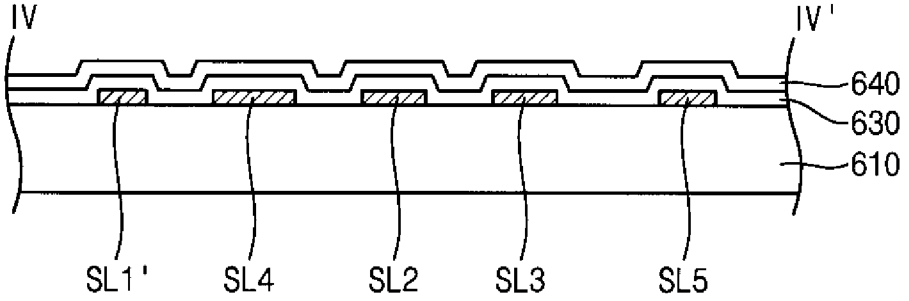
FIG. 9 is a cross-sectional view taken along line IV-IV' in FIG. 8.

FIG. 8 is an enlarged view showing a portion of the exemplary wiring section in FIG. 7. FIG. 9 is a cross-sectional view taken along line IV-IV' in FIG. 8.

Referring to FIG. 8, in the wiring section LS, the second start signal wiring SL1', the off-voltage wiring SL4, and the first and second clock wirings SL2 and SL3 are disposed substantially in parallel with each other. The wiring section LS may further include a first pad P1 extended from the second start signal wiring SL1', a second pad P2 extended from the off-voltage wiring SL4, a third pad P3 extended from the first clock signal wiring SL2, and a fourth pad P4 extended from the second clock wiring SL3. Therefore, the second start signal wiring SL1', the off-voltage wiring SL4, and the first and second clock wirings SL2 and SL3 receive the start signal STV, the off-voltage Voff, and the first and second clock signals CKV and CKVB through the first through fourth pads P1, P2, P3, and P4, respectively.

The wiring section LS may further include first, second, and third connecting wirings CL1, CL2, and CL3. The first connecting wiring CL1 electrically connects the off-voltage wiring SL4 to the off-voltage terminal V1 of the first through (n+1)-th stages SRC1~SRCn+1. The second connecting wiring CL2 electrically connects the first clock wiring SL2 to the first clock terminal CK1 of the odd-numbered stages SRC1, SRC3, . . . , SRCn+1, and electrically connects the first clock wiring SL2 to the second clock terminal CK2 of the even-numbered stages SRC2, . . . , SRCn. Also, the third connecting wiring CL3 electrically connects the second clock wiring SL3 to the first clock terminal CK1 of the even-numbered stages SRC2, . . . , SRCn, and electrically connects the second clock wiring SL3 to the second clock terminal CK2 of the odd-numbered stages SRC1, SRC3, . . . , SRCn+1.

As stated above, the second start signal wiring SL1' is disposed from the circuit section CS further than other signal wirings, so that the second start signal wiring SL1' does not cross over the connecting wirings that connect the other signal wirings to the circuit section CS. Therefore, a distortion of a signal that is applied from the circuit section CS is prevented.

As shown in FIGS. 8 and 9, the second start signal wiring SL1', the off-voltage wiring SL4, and the first and second clock wirings SL2, SL3 are formed from a first metal layer and disposed on the first base substrate 610 of the array substrate 600. Then, the second start signal wiring SL1', the off-voltage wiring SL4, the first and second clock wirings SL2, SL3 and the first substrate 610 are covered by a gate insulating layer 630. Then, the first start signal wiring SL1, and the first through third connecting wirings CL1, CL2, and CL3 are formed on the gate insulating layer 630. The first start signal wiring SL1 and the first through third connecting wirings CL1, CL2, and CL3 are formed from a second metal layer. Then, the first start signal wiring SL1, the first through third connecting wirings CL1, CL2, and CL3 and the gate insulating layer 630 are covered by a protecting layer 640.

The off-voltage wiring SL4 and the first connecting wiring CL1 are electrically connected to each other in a first contact area C1, the first clock wiring SL2 and the second connecting wiring CL2 are electrically connected to each other in a second contact area C2, and the second clock wiring SL3 and the third connecting wiring CL3 are electrically connected to each other in a third contact area C3. Further, the first start signal wiring SL1 and the second start signal wiring SL1' are electrically connected to each other in a fourth contact area C4. Therefore, the first start signal wiring SL1 is electrically insulated from the off-voltage wiring SL4, the first clock wiring SL2, and the second clock wiring SL3 by the gate insulating layer 630, and the first start signal wiring SL1 crosses the off-voltage wiring SL4, the first clock wiring SL2, and the second clock wiring SL3.

Figure 10:
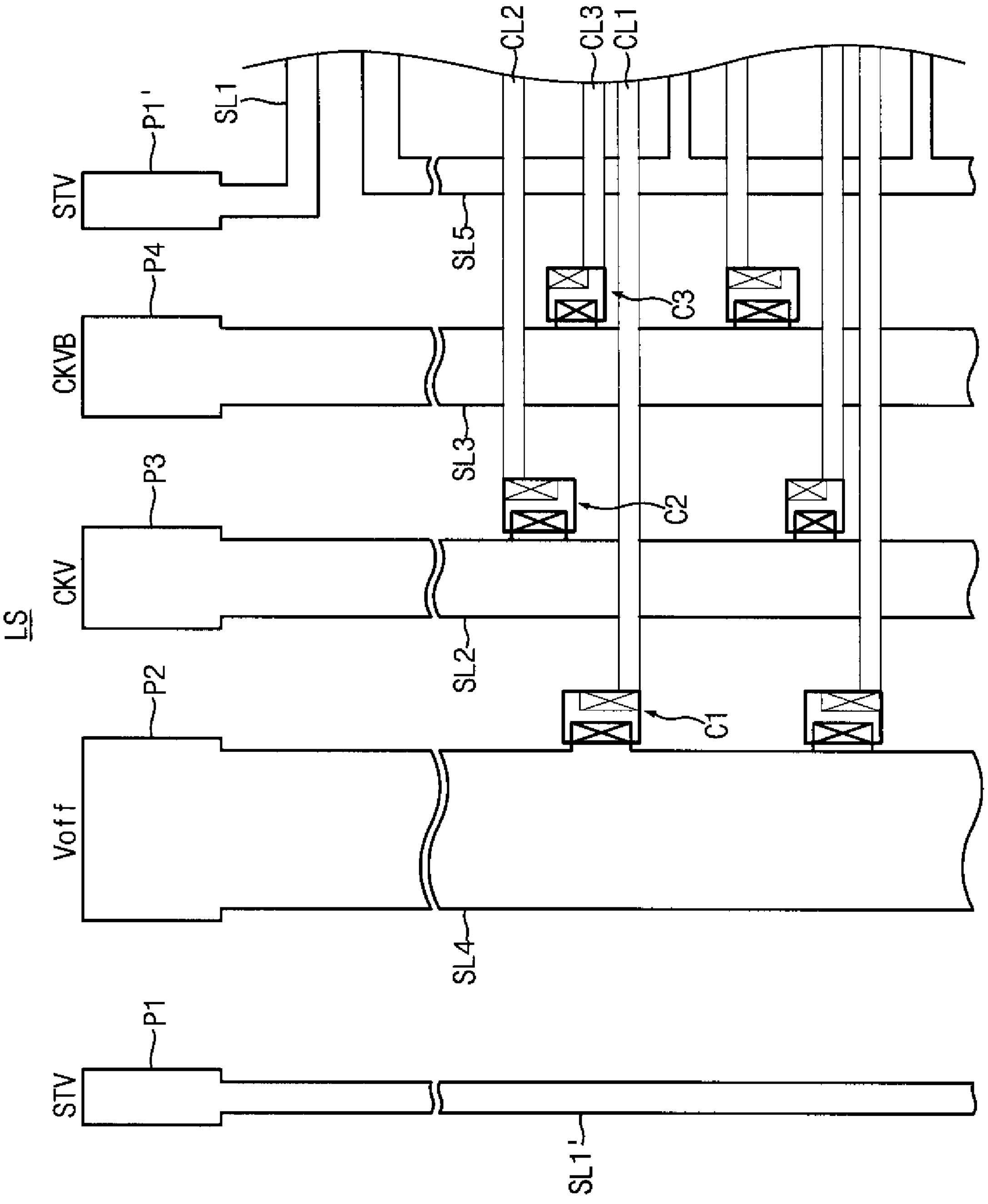
FIG. 10 is an enlarged view showing a portion of still another exemplary embodiment of the wiring section according to the present invention.

FIG. 10 is an enlarged view showing a portion of still another exemplary embodiment of the wiring section according to the present invention. The wiring section of FIG. 10 is substantially the same as in FIG. 9. Thus, the same reference numerals will be used to refer to the same or like parts as those described in FIG. 9 and any further explanation concerning the above elements will be omitted.

Referring to FIG. 10, a second start signal wiring SL1', an off-voltage wiring SL4, and first and second clock wirings SL2 and SL3 are disposed substantially in parallel with each other. The first start signal wiring SL1 is spaced apart from the second start signal wiring SL1'. The first start signal wiring SL1 is disposed such that a distance between the first start signal wiring SL1 and the circuit section CS is smaller than a distance between the second start signal wiring SL1' and the circuit section CS. Out of the wirings SL1, SL2, SL3, SL4, and SL1', the first start signal wiring SL1 is the closest to the circuit section CS and the second start signal wiring SL1' is the furthest from the circuit section CS. The first start signal wiring SL1 is also electrically insulated from the second start signal wiring SL1'.

The wiring section LS may further include a fifth pad P1' in addition to the first through fourth pads P1, P2, P3, and P4. The first pad P1 is extended from the second start signal wiring SL1', and the second pad P2 is extended from the off-voltage wiring SL4. The third and fourth pads P3 and P4 are extended from the first and second clock wirings SL2 and SL3, respectively. The fifth pad P1' is extended from the first start signal wiring SL1. Therefore, the first and second start signal wirings SL1 and SL1' receive the start signal STV through the first and fifth pads P1' and P1, respectively.

The first start signal wiring SL1, the second start signal wiring SL1', the off-voltage wiring SL4, the first clock wiring SL2, and the second clock wiring SL3 are formed from a same metal layer.

As described above, the first start signal wiring SL1 receives the start signal STV through the fifth pad P1' that is different from the first pad P1 of the second start signal wiring SL1', so that the first start signal wiring SL1 does not cross with other signal wirings.

Figure 11:
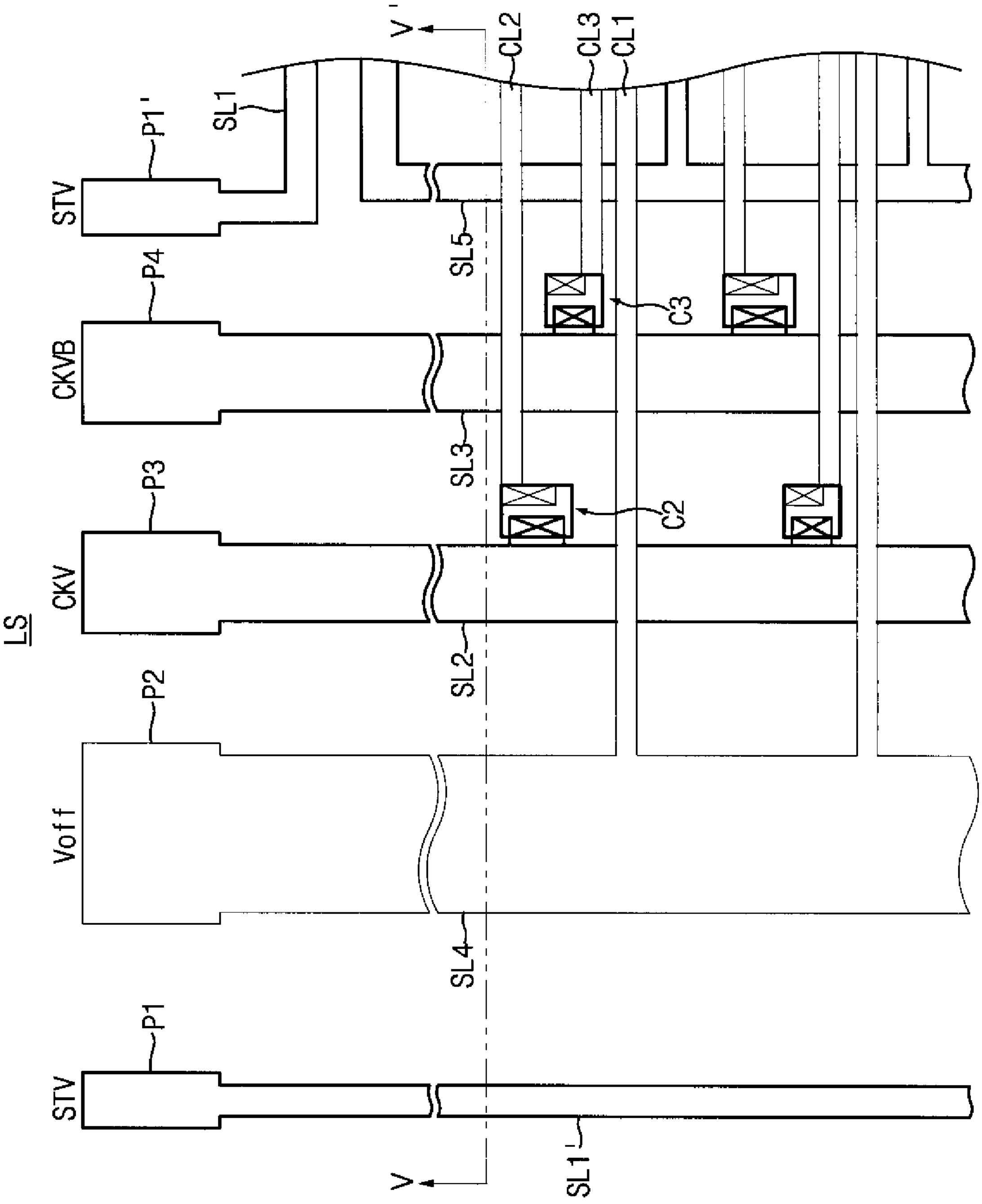
FIG. 11 is an enlarged view showing another further exemplary embodiment of a portion of the wiring section according to the present invention.
Figure 12:
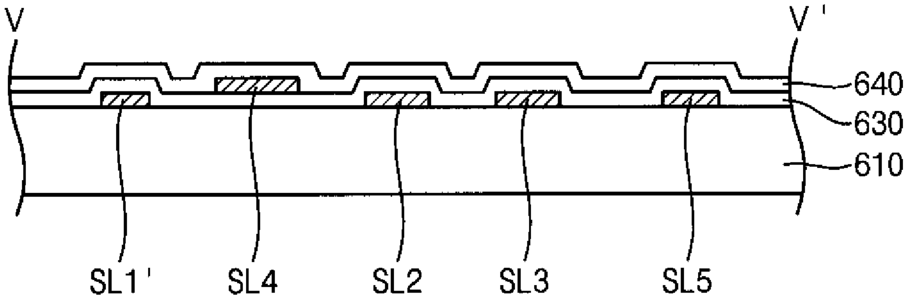
FIG. 12 is a cross-sectional view taken along line V-V' in FIG. 11.

FIG. 11 is an enlarged view showing a further exemplary embodiment of a portion of the wiring section according to the present invention. FIG. 12 is a cross-sectional view taken along line V-V' in FIG. 11. The same reference numerals will be used to refer to the same or like parts as those described in FIGS. 8 to 10 and any further explanations concerning the above elements will be omitted.

Referring to FIGS. 11 and 12, a second start signal wiring SL1', an off-voltage wiring SL4, and first and second clock wirings SL2 and SL3 are disposed substantially in parallel with each other.

The first start signal wiring SL1, the second start signal wiring SL1', the first and second clock wirings SL2 and SL3, and the reset wiring SL5 are formed from a first metal layer and disposed on the first base substrate 610. Then, the first start signal wiring SL1, the second start signal wiring SL1', the first clock wiring SL2, the second clock wiring SL3, the reset wiring SL5, and the first base substrate 610 are covered by a gate insulating layer 630. An off-voltage wiring SL4, a first connecting wiring CL1, a second connecting wiring CL2, and a third connecting wiring CL3 are formed on the gate insulating layer 630. The off-voltage wiring SL4, and the first through third connecting wirings CL1, CL2, and CL3 are formed from a second metal layer. Then, the off-voltage wiring SL4, the first through third connecting wirings CL1, CL2, and CL3, and the gate insulating layer 630 are covered by a protecting layer 640.

The first clock wiring SL2 and the second connecting wiring CL2 are electrically connected to each other in a second contact area C2, and the second clock wiring SL3 and the third connecting wiring CL3 are electrically connected to each other in a third contact area C3. The first connecting wiring CL1 is extended from the off-voltage wiring SL4. Therefore, because the first connecting wiring CL1 and the off-voltage wiring SL4 are both formed from the second metal layer, a contact area that electrically connects the off-voltage wiring SL4 and the first connecting wiring CL1 is not required as in the embodiment of FIG. 8. Thus, an erosion occurring in a contact area of the off-voltage wiring SL4 is prevented.

Figure 13:
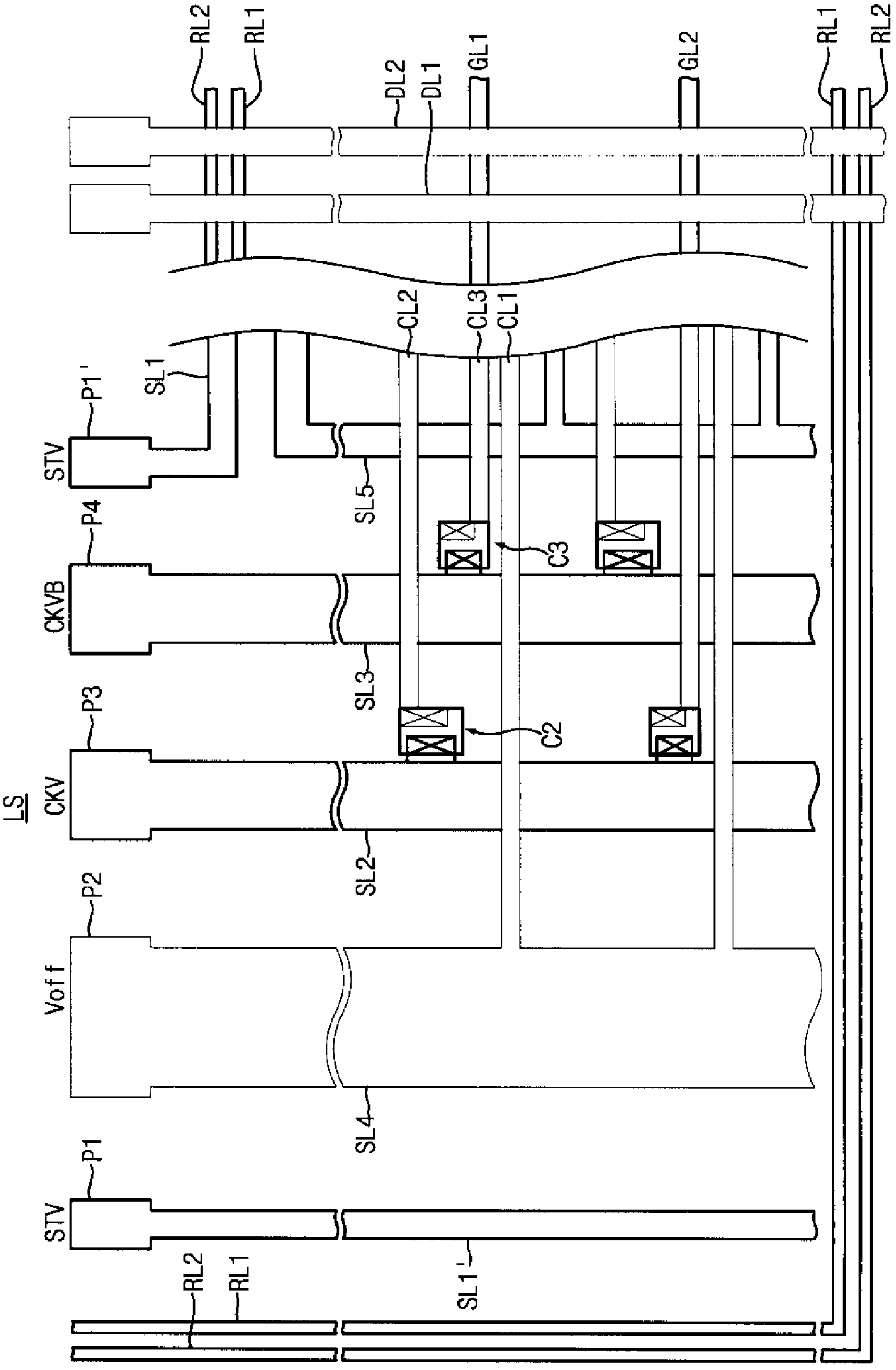
FIG. 13 is an enlarged view showing yet another exemplary embodiment of a portion of a wiring section and a display area according to the present invention.

FIG. 13 is an enlarged view showing yet another exemplary embodiment of a portion of a wiring section and display area according to the present invention. The same reference numerals will be used to refer to the same or like parts as those described in FIGS. 8 to 12 and any further explanations concerning the above elements will be omitted.

Referring to FIG. 13, a first repair wiring RL1 and a second repair wiring RL2 are further formed on a peripheral area A2 adjacent to the wiring section LS. The first and second repair wirings RL1 and RL2 of the peripheral area A2 and a first gate line GL1 and a second gate line GL2 (as well as other gate lines not illustrated) of a display area A1 are formed from a same metal layer. The first and second repair wirings RL1 and RL2 are disposed at an external portion of the wiring section LS. The first and second repair wirings RL1 and RL2 are extended to the display area A1. The first and second repair wirings RL1 and RL2 are insulated from the data lines DL1 and DL2 (as well as other data lines not illustrated), and cross the data lines DL1 and DL2 that are formed in the display area A1. Particularly, the second start signal wiring SL1' among the signal wirings of the wiring section LS is disposed adjacent to the first and second repair wirings RL1 and RL2.

When one of the data lines DL1 and DL2 is opened, the opened data line is electrically connected to the first repair wiring RL1 through a repair process. In particular, the opened data line is electrically connected to the first repair wiring RL1 by irradiating a laser onto a portion where the opened data line crosses the first repair line RL1. Therefore, a data signal that is provided to a first edge portion of the opened data line is applied to a second edge portion of the opened data line through the first repair wiring RL1. Thus, a line error of a display panel, which is induced by opening of a data line, may be cured.

When a remaining data line is opened, the opened data line may be repairable through the first repair wiring RL1 by using a repair process.

According to the gate driver circuit and the display device having the gate driver circuit, a start signal wiring is disposed at a portion adjacent to one side of the driving section, and the other wirings of the wiring section are disposed at a portion adjacent to the other side of the driving section. Therefore, the start signal wiring and first through third connecting wirings do not cross to each other, so that a distortion of signals applied to the driving section through the first through third connecting wirings is prevented.

Further, a second start signal wiring that transmits the start signal to the second input terminal of a last stage is disposed further away from a circuit section than an off-voltage wiring, and first and second clock wirings. Thus, an overlap between the second start signal wiring and the first through third connecting wirings is prevented, and a distortion of a signal applied to the gate driver through the first through third connecting wirings is prevented. As a result, a maloperation of the gate driver and the display device is prevented.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A gate driver circuit comprising:

a driving section providing a gate signal;

a first wiring section receiving a plurality of signals;

at least one connecting wiring connecting the first wiring section to the driving section; and a start signal wiring transmitting a start signal to only a first stage and a last stage of the plurality of stages, wherein the start signal wiring does not cross the at least one connecting wiring.

2. The gate driver circuit of claim 1, wherein the start signal wiring includes a first start signal wiring transmitting the start signal to the first stage of the plurality of stages, and a second start signal wiring transmitting the start signal to the last stage of the plurality of stages.

3. The gate driver circuit of claim 2, wherein the first wiring section is disposed between the second start signal wiring and the driving section.

4. The gate driver circuit of claim 3, wherein the first start signal wiring is electrically connected to the second start signal wiring, and the first start signal wiring is substantially parallel to the at least one connecting wiring.

5. The gate driver circuit of claim 1, wherein the first wiring section includes a first clock wiring transferring a first clock signal to the driving section via a first connecting wiring, and a second clock wiring transferring a second clock signal to the driving section via a second connecting wiring, wherein the second clock signal has an opposite phase to the first clock signal.

6. A display device comprising:

a display panel which displays an image and including an array substrate having a plurality of gate lines and a plurality of data lines, the array substrate receives a gate signal and a data signal and facing an opposite substrate;

a gate driver circuit having a wiring section which receives a plurality of signals from an external device, and a driving section including a plurality of stages electrically connected one after another to each other, the plurality of stages receives a plurality of signals from the wiring section and sequentially applying the gate signal to the plurality of gate lines; and a data driver circuit which outputs a data signal to the plurality of data lines;

wherein the wiring section includes:

at least one first signal wiring electrically connected to at least two stages of the plurality of stages;

a second signal wiring electrically connected to a first stage of the plurality of stages; and a third wiring electrically connected to a single and last stage of the plurality of stages, and the first signal wiring is disposed between the third signal wiring and the driving section.

7. The display device of claim 6, wherein the second signal wiring is electrically connected to the third signal wiring.

8. The display device of claim 7, wherein the second signal wiring is formed on a gate insulating layer, the gate insulating layer covering the at least one first signal wiring and the third signal wiring, the second signal wiring electrically connected to the third signal wiring through a contact area formed through the gate insulating layer.

9. The display device of claim 7, wherein the second signal wiring extends substantially parallel to connecting wiring connecting the at least one first signal wiring to the at least two stages of the plurality of stages.

10. The display device of claim 7, wherein the second signal wiring and the third signal wiring transmit a start signal to the first stage and the last stage, respectively.

11. The display device of claim 6, further comprising a pad receiving a start signal from an external device.

12. The display device of claim 6, wherein the wiring section comprising:

a first pad receiving a start signal from an external device, the first pad extended from the second signal wiring;

a second pad receiving a start signal from an external device, the second pad extended from the third signal wiring; and a third pad receiving a plurality of signals from an external device, the third pad extended from the first signal wiring, wherein the third pad is disposed between the first pad and the second pad.

13. The display device of claim 6, wherein the second signal wiring applies a start signal activating an operation of the first stage to an input terminal of the first stage, and the third signal wiring applies the start signal to a control terminal of the last stage.

14. The display device of claim 6, wherein the first signal wiring comprises:

a first clock wiring transferring a first clock signal to the plurality of stages;

a second clock wiring transferring a second clock signal to the plurality of stages, the second clock signal having opposite phase to the first clock signal; and an off-voltage wiring providing an off-voltage to the plurality of stages.

15. The display device of claim 14, wherein the first signal wiring further comprises a reset wiring resetting the plurality of stages by providing the plurality of stages with a gate signal outputted from the last stage of the plurality of stages.

16. The display device of claim 6, wherein the array substrate comprises a display area and a peripheral area adjacent to the display area, the display area including a pixel array electrically connected to the plurality of gate lines and the plurality of data lines, the pixel array receiving the gate signal and data signal, the peripheral area including the gate driver circuit formed on the peripheral area simultaneously through a same process as the pixel array.

17. The gate driver circuit of claim 3, wherein the first start signal wiring is separated from the second start signal wiring by the first wiring section.

18. The display device of claim 6, wherein the array substrate further comprises a repair wiring crossing first and second edge portions of the plurality of data lines, is the repair wiring electrically connected to an opened data line among the plurality of data lines, and, the third signal wiring disposed between a portion of the repair wiring and the first signal wiring.

* * * * *